(12) United States Patent
Kubota et al.

(10) Patent No.: US 7,402,939 B2
(45) Date of Patent: Jul. 22, 2008

(54) ORGANIC EL DISPLAY

(75) Inventors: Hirofumi Kubota, Kanazawa (JP);
Satoshi Okutani, Ishikawa-gun (JP);
Tsuyoshi Uemura, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 500 days.

(21) Appl. No.: 11/234,181

(22) Filed: Sep. 26, 2005

(65) Prior Publication Data
US 2006/0066230 A1    Mar. 30, 2006

(30) Foreign Application Priority Data
Sep. 28, 2004   (JP) .............. 2004-282676

(51) Int. Cl.
*H01J 5/16* (2006.01)
*H01J 61/40* (2006.01)
*H01K 1/26* (2006.01)
*H01K 1/30* (2006.01)

(52) U.S. Cl. ............... 313/110; 313/498; 313/504; 313/506; 313/512

(58) Field of Classification Search ...... 313/498–512, 313/110, 112, 113, 478
See application file for complete search history.

(56) References Cited

U.S. PATENT DOCUMENTS

| | | | |
|---|---|---|---|
| 2002/0180348 A1* | 12/2002 | Oda et al. | 313/506 |
| 2004/0013076 A1* | 1/2004 | Funato et al. | 369/112.12 |
| 2004/0183433 A1* | 9/2004 | Cho et al. | 313/504 |
| 2005/0023967 A1* | 2/2005 | Gotoh et al. | 313/504 |
| 2005/0026530 A1* | 2/2005 | Toguchi et al. | 445/24 |
| 2005/0077820 A1* | 4/2005 | Onishi et al. | 313/506 |

FOREIGN PATENT DOCUMENTS

| | | |
|---|---|---|
| JP | 2991183 | 10/1999 |
| JP | 2003-115377 | 4/2003 |

* cited by examiner

*Primary Examiner*—Karabi Guharay
*Assistant Examiner*—Kevin Quarterman
(74) *Attorney, Agent, or Firm*—Oblon, Spivak, McClelland, Maier & Neustadt, P.C.

(57) ABSTRACT

An organic EL display includes an insulating layer with light-transmission property, an organic EL element located on a back side of the insulating layer, a diffraction grating located on the back side of the insulating layer, and an optical film disposed on a front side of the insulating layer and including optically isotropic first portions and optically anisotropic second portions, the first and second portions forming boundaries inclined with respect to a main surface of the optical film.

16 Claims, 3 Drawing Sheets

ORGANIC EL DISPLAY

CROSS-REFERENCE TO RELATED APPLICATIONS

This application is based upon and claims the benefit of priority from prior Japanese Patent Application No. 2004-282676, filed Sep. 28, 2004, the entire contents of which are incorporated herein by reference.

BACKGROUND OF THE INVENTION

1. Field of the Invention

The present invention relates to an organic electroluminescent (EL) display.

2. Description of the Related Art

Organic EL displays are of a self-emission type, and they can achieve a wide viewing angle and high-speed response. Further, the organic EL displays do not require backlights, and therefore they can be made low-profile and lightweight. For these reasons, the organic EL displays attract attention as displays that may replace liquid crystal displays.

An organic EL element, which is the main part of an organic EL display, includes a light-transmitting front electrode, a light-transmitting back electrode facing the front electrode, and an organic layer interposed therebetween and including a light-emitting layer. The organic EL element is a self-emission element of charge-injection type, which emits light as electric current flows through its organic layer.

In order to display an image on an organic EL display, it is necessary to make light emitted by the light-emitting layer output from the front electrode. However, of the light traveling toward the front surface side within the element, light components traveling in wide-angle directions are totally reflected on a surface of the front electrode. For this reason, a great portion of the light emitted by the organic layer cannot be extracted from the organic EL element. In other words, the conventional organic EL display entails a problem of a low outcoupling efficiency.

As a solution to such a problem, Japanese Patent No. 2991183 discloses a technique which utilizes a diffraction grating. With this technique, the outcoupling efficiency of the organic EL element can be raised. However, the present inventors have found through the process of achieving the present invention that the viewing angle is significantly narrowed if a diffraction grating is used to raise the outcoupling efficiency in the organic EL element.

BRIEF SUMMARY OF THE INVENTION

According to a first aspect of the present invention, there is provided an organic EL display comprising an insulating layer with light-transmission property, an organic EL element disposed on a back side of the insulating layer, a diffraction grating disposed on the back side of the insulating layer, and an optical film disposed on a front side of the insulating layer and comprising optically isotropic first portions and optically anisotropic second portions, the first and second portions forming boundaries inclined with respect to a main surface of the optical film.

According to a second aspect of the present invention, there is provided an organic EL display comprising an insulating layer with light-transmission property, an organic EL element disposed on a back side of the insulating layer, a diffraction grating disposed on the back side of the insulating layer, and an optical film disposed on a front side of the insulating layer and comprising optically isotropic first portions and optically anisotropic second portions, the first and second portions forming a stripe pattern inclined with respect to a main surface of the optical film when a cross section of the optical film perpendicular to the main surface is observed.

DETAILED DESCRIPTION OF THE INVENTION

Figure 1:
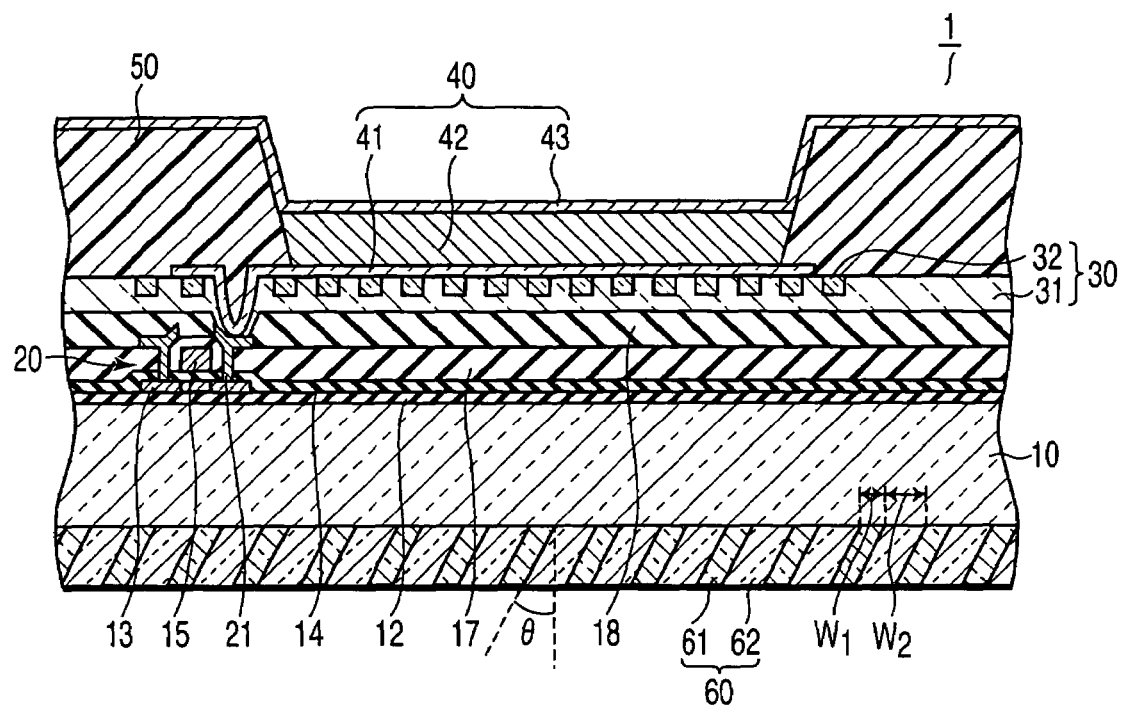
FIG. 1 is a cross sectional view schematically showing an organic EL display according to a first embodiment of the present invention.

Embodiments of the present invention will be described below in detail with reference to the accompanying drawing. The same reference numerals denote constituent elements having the same or similar functions throughout the drawing, and repetitive description thereof will be omitted.

FIG. 1 is a cross sectional view schematically showing an organic EL display according to the first embodiment of the present invention. In FIG. 1, the organic EL display 1 is illustrated such that its display surface, that is, the front surface, faces downwardly and the back surface faces upwardly.

The organic EL display 1 is a bottom emission organic EL display which employs an active matrix drive method. The display 1 includes, as a transparent substrate, an insulating substrate 10 with light-transmission property such as a glass substrate. On a back surface of the transparent substrate 10, pixels are arranged in a matrix form. Each pixel includes, for example, a drive control element 20 and organic EL element 40 connected in series between a pair of power supply terminal, and a pixel switch (not shown). The drive control element 20 has a control terminal connected to a video signal line (not shown) via the pixel switch and outputs a current, whose magnitude corresponds to a video signal supplied from the video signal line, to the organic. EL element 40. A control terminal of the pixel switch is connected to a scan signal line (not shown), and a switching operation of the control switch is controlled by a scan signal supplied from the scan signal line. Note that other structures can be employed for the pixels.

On the substrate 10, as an undercoat layer 12, for example, an $SiN_x$ layer and an $SiO_x$ layer are arranged in this order. A semiconductor layer 13 such as a polysilicon layer in which a channel, source and drain are formed, a gate insulator 14 which can be formed with use of, for example, TEOS (tetraethyl orthosilicate), and a gate electrode 15 made of, for example, MoW, are arranged in this order on the undercoat layer 12, and these layers form a top gate-type thin film transistor (referred to as a TFT hereinafter). In this embodiment, the TFTs are used as TFTs of the drive control element 20 and the pixel switch. Further, on the gate insulator 14, scan signal lines (not shown) which can be formed in the same step as that for the gate electrode 15 are arranged.

An interlayer insulating film 17 made of, for example, SiO$_x$ which is deposited by a plasma CVD method, covers the gate insulator 14 and gate electrode 15. Source and drain electrodes 21 are arranged on the interlayer insulating film 17, and they are buried in a passivation film 18 made of, for example, SiN$_x$. The source and drain electrodes 21 have, for example, a three-layer structure of Mo/Al/Mo, and electrically connected to the source and drain of the TFT via contact holes formed in the interlayer insulating film 17. Further, on the interlayer insulating film 17, video signal lines (not shown) which can be formed in the same step as that for the source and drain electrodes 21 are arranged.

A diffraction grating 30 is located on the passivation film 18. Here, as an example, the diffraction grating 30 includes a first portion 31 whose surface in contact with the organic EL element 40 is provided with a predetermined pattern of recesses, and second portions 32 which fill the recesses and are made of a material different in optical properties from the first portion 31. An organic insulating material such as a resist or polyimide can be used for the first portion 31 and the second portion 32 of the diffraction grating 30. The pattern formed on the surface of the first portion 31 can be designed in various ways such as a stripe pattern or lattice pattern. The first portion 31 may be integrated with a layer adjacent to the diffraction grating 30 such as the passivation film 18. The second portions 32 are not essential and may not be provided. For example, it is possible that the second portions are omitted from the structure and the recess portions of the first portion 31 are filled with front electrodes 41 or the like, which will be described later. The passivation film 18 and the diffraction grating 30 are provided with through-holes each communicating with the drain electrode 21.

On the diffraction grating 30, front electrodes 41 with light-transmission property are arranged spaced apart from one another. In this embodiment, the front electrodes 41 are anodes and made of, for example, a transparent conductive oxide such as an ITO (indium tin oxide). Each front electrode 41 is electrically connected to the drain electrode 21 via the through-holes formed in the passivation film 18 and the diffraction grating 30.

A partition insulating layer 50 is further placed on the diffraction grating 30. In the partition insulating layer 50, through-holes are formed at positions corresponding to the front electrodes 41. The partition insulating layer 50 is an organic insulating layer, for example, and can be formed by using a photolithography technique.

An organic layer 42 including a light emitting layer is placed on each front electrode 41. The light emitting layer is a thin film containing a luminescent organic compound which can generate a color of, for example, red, green or blue. The organic layer 42 can further include a layer other than the light emitting layer. For example, the organic layer 42 can further include a buffer layer which serves to mediate the injection of holes from the front electrode 41 into the emitting layer. The organic layer 42 can further contain a hole transporting layer, a hole blocking layer, an electron transporting layer, an electron injection layer, etc.

The partition insulating layer 50 and the organic layer 42 are covered with a back electrode 43 with light-reflection property. The second electrode 43 is a cathode which is continuously formed and common to all pixels. The back electrode 43 is electrically connected to an electrode wiring, the electrode wiring being formed on the layer on which video signal lines are formed, via contact holes (not shown) formed in the passivation film 18, the diffraction grating 30, and the partition insulating layer 50. Each organic EL element 40 includes the front electrode 41, organic layer 42 and back electrode 43.

An optical film 60 is located on a front surface of the transparent substrate 10. The optical film 60 includes optically isotropic first portions 61 and optically anisotropic second portions 62. The first portions 61 and the second portions 62 form boundaries inclined with respect to a main surface of the optical film 60 when a cross section of the optical film 60 perpendicular to the main surface is observed. Typically, the boundaries are substantially parallel to one another, and optic axes of the second portions 62 are substantially parallel to each of the boundaries. The first portions 61 and the second portions 62 form, for example, a stripe pattern when the optical film 60 is observed in a direction perpendicular to the main surface. The optical film 60 having such a structure can be formed, for example, by alternately stacking optically isotropic layers and optically anisotropic layers.

In many cases, the organic EL display 1 shown in FIG. 1 further includes a sealing substrate (not shown) facing the back electrode 43, and a seal layer located on a periphery of a surface of the sealing substrate facing the back electrode 43. In this structure, an airtight enclosed space surrounded by the transparent substrate 10, the sealing substrate, and the seal layer is formed. The space can be filled with, for example, a rare gas such as Ar gas or an inert gas such as N$_2$ gas.

As described above, the organic EL display 1 includes the optical film 60 on the front surface of the transparent substrate 10, and the optical film 60 has a structure in which the first portions 61 and the second portions 62 form boundaries inclined with respect to a main surface of the optical film 60. In the case where such an optical film 60 is used, more light components can be extracted from the organic EL display 1 as compared with the case where the optical film 60 is omitted or the case where the boundaries are perpendicular to the main surface of the optical film 60. In addition, in the case where the optical film 60 having such a structure is used, a wider viewing angle can be achieved as compared with the case where the optical film 60 is omitted or the case where the boundaries are perpendicular to the main surface of the optical film 60. Namely, according to the present embodiment, both a high outcoupling efficiency and a wide viewing angle can be achieved.

Next, the second embodiment of the present invention will be described.

Figure 2:
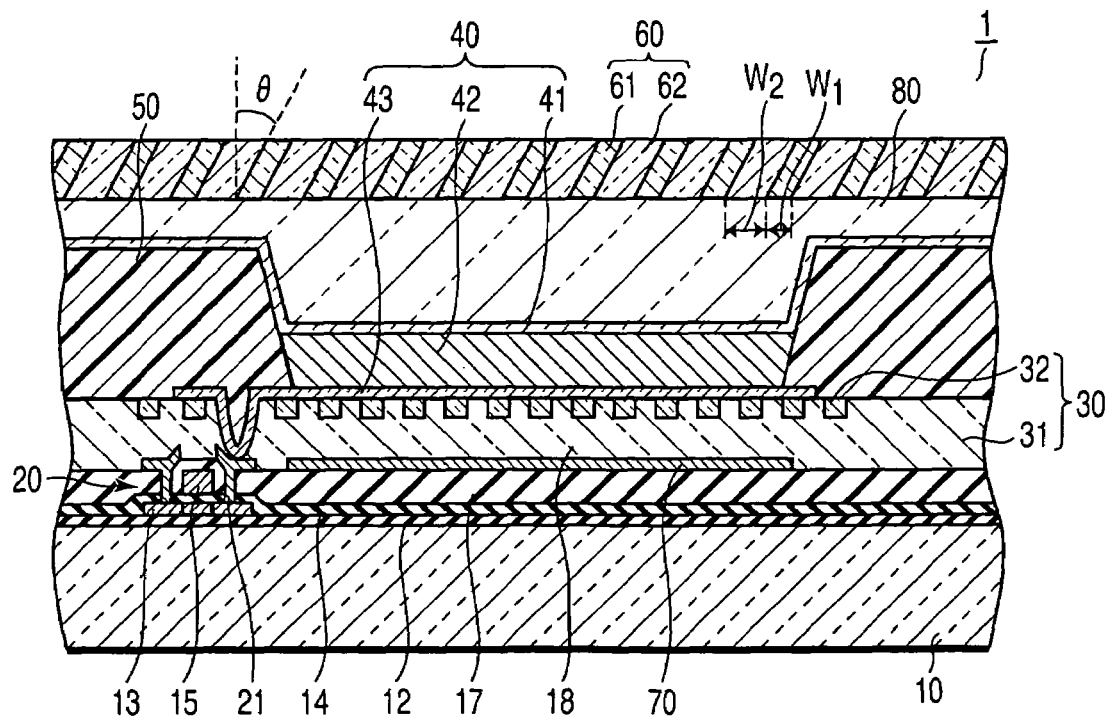
FIG. 2 is a cross sectional view schematically showing an organic EL display according to a second embodiment of the present invention.

FIG. 2 is a cross sectional view schematically showing an organic EL display according to the second embodiment of the present invention. In FIG. 2, the organic EL display 1 is illustrated such that its display surface, that is, the front surface, faces upwardly and the back surface faces downwardly.

The organic EL display 1 is a top emission organic EL display which employs an active matrix drive method. In the display 1, unlike the first embodiment, the substrate 10 need not have light-transmission property.

On the substrate 10, similar to the first embodiment, an undercoat layer 12, TFTs 20, an interlayer insulating film 17, and a passivation film 18 are formed in this order. Contact holes are formed in a gate insulator 14, the interlayer insulating film 17, and the passivation film 18. Source and drain electrodes 21 are electrically connected to source and drain of the TFT via the contact holes, respectively.

On the interlayer insulating film 17, a reflective layer and a first portion 31, which is integrated with the passivation film in this embodiment, of a diffraction grating 30 are placed in this order. As a material of the reflective layer 70, for example, metal material such as Al can be used. In this case, the reflective layer 70 has a three-layer structure of Mo/Al/Mo in order to form the reflective layer 70, source and drain electrodes 21 in the same step. As the material of the first portion 31, for example, insulator such as an $SiN_x$ can be used.

The recesses of the first portion 31 are filled with second portions 32 made of a light-transmitting insulating material with a refractive index greater than that of the first portion 31, for example, a resist-material. The first portion 31 and the second portions 32 form a diffraction grating 30.

On the diffraction grating 30, back electrodes 43 with light-transmission property are arranged spaced apart from one another. In this embodiment, the back electrodes 43 are anodes and made of, for example, a transparent conductive oxide such as an ITO.

On the diffraction grating 30, a partition insulating layer 50 is further located as described in the first embodiment. In addition, similar to the first embodiment, organic layers 42 each including a light-emitting layer are formed on the back electrodes 43.

A front electrode 41 with light-transmission property is formed on the partition insulating layer 50 and the organic layer 42. In this embodiment, The front electrode 41 is a common electrode as a cathode.

On the front electrode 41, a transparent protective film 80 as a light-transmitting insulating layer and a light-scattering layer 60 are located in this order. The transparent protective film 80 prevents moisture and the like from entering into the organic EL elements 40 and serves as a flattening layer. A transparent resin can be used as a material of the transparent protective film 80. The transparent protective film 80 may have a single-layer structure or a multi-layer structure.

In the first embodiment, the diffraction grating 30 is located between the organic EL elements and the transparent substrate 10 as a light-transmitting insulating layer. In other words, the diffraction grating 30 is located on the front side of the organic EL elements 40. On the other hand, in the second embodiment, the diffraction grating 30 is located between the organic El elements 40 and the reflective layer 70. In other words, the diffraction grating 30 is located on the back side of the organic EL elements 40. When such a structure is employed, advantages similar to those described in the first embodiment can be obtained.

It is noted that when the diffraction grating is located on the back side of the organic EL elements 40, a portion of light-components emitted by each organic element 40 enters the light-transmitting insulating layer without passing through the diffraction grating 30. Therefore, it is advantageous to locate the diffraction grating 30 between the organic EL elements 40 and the light-transmitting insulating layer in order to increase light components to be diffracted.

In the first and second embodiments, as the diffraction grating 30, one-dimensional grating and two-dimensional grating can be used. In order to increase light components to be diffracted, the two-dimensional grating is advantageous.

Although a transmission grating is used as the diffraction grating 30 in the first and second embodiments, a reflection grating may be used as the diffraction grating 30. For example, it is possible to employ a structure in which the diffraction 30 shown in FIG. 2 is omitted and the front surface of the reflective layer 70 is provided with recesses and/or protrusions, thereby forming a diffraction grating.

When the diffraction grating 30 includes the light-transmitting first portion 31 and the second portions 32 filling the recesses of the first portion, the second portions 32 should be different in optical property from the first portion 31 as described above. The first portion 31 and the second portions 32 may be different from each other in at least one of refractive index, transmittance, and reflectance. Typically, the second portions 32 have light-transmission property and are different in refractive index from the first portion 31.

Each bottom surface of the recesses which the first portion 31 forms may be a surface of the first portion 31. Alternatively, each bottom surface of the recesses which the first portion 31 forms may be a surface of the underlayer on which the first portion 31 is formed.

At least one of the first portion 31 and the second portions 32 may have a refractive index higher than that of a layer in contact with the diffraction grating 30 on the side of the organic EL elements 40. In this case, multi-beam interference is enhanced in a layer adjacent to the diffraction grating 30 on the side of the organic EL elements 40.

A grating constant of the diffraction grating 30 may be about 0.1 μm to about 0.8 μm, for example. The grating constant of the diffraction grating 30 may be changed between the organic EL elements 40 which are different in emission color from each other. Alternatively, the grating constant of the diffraction grating 30 may be the same between the organic EL elements 40 which are different in emission color from each other.

Figure 3:
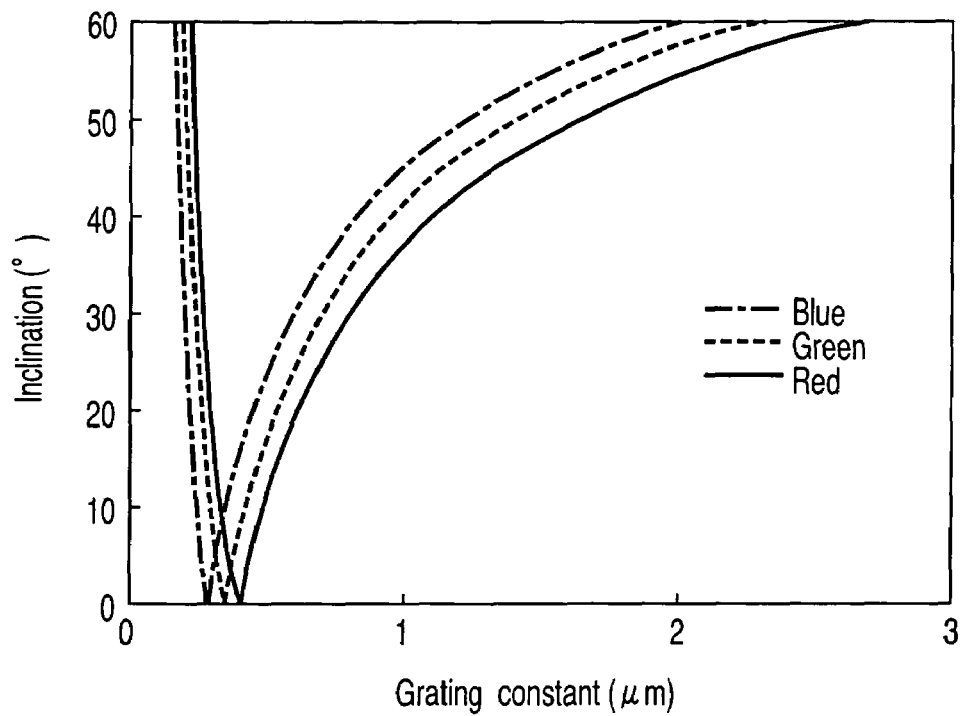
FIG. 3 is a graph illustrating a relationship between a grating constant of a diffraction grating and an incident angle of first-order diffracted light on an optical film of the organic EL display shown in FIG. 1.

FIG. 3 is a graph illustrating a relationship between a grating constant of the diffraction grating 30 and an incident angle of first-order diffracted light on the optical film 60 of the organic EL display 1 shown in FIG. 1. In the figure, the abscissa indicates a grating constant of the diffraction grating 30, and the ordinate indicates an incident angle of first-order diffracted light on the optical film 60.

The data shown in FIG. 3 is obtained by carrying out a simulation under the conditions below. That is, a thickness of a layered structure of the organic layer 42 and the front electrode 41 was set at 250 nm, and a refractive index of the layered structure was set at 1.9. As the organic layers 42, organic layers whose emitting colors are blue, green and red were considered, and wavelengths of lights emitted by the organic layers were set at 440 nm, 540 nm, and 620 nm, respectively.

Further, multi-beam interference in the layered structure of the organic layer 42 and the front electrode 41 was considered, and diffraction by the diffraction grating 30 was calculated on a light component with the highest intensity propagating in an in-plane direction in the layered structure. More specifically, diffraction by the diffraction grating 30 was calculated based on an angle which a traveling direction of the light component with the highest intensity propagating in the in-plane direction in the layered structure makes with respect to a film surface by using the wavelength, the thickness of the layered structure, and the refractive index described above. Since 0-ordered diffracted light does not change its traveling direction and the diffracted lights higher in order of diffraction than first-order diffracted light are very weak, only the first-order diffracted light was considered.

As shown in FIG. 3, when the grating constant of the diffraction grating 30 is constant, the incident angle of the first-order diffracted light on the optical film 60 changes according to the emitting color. Therefore, in order to equalize the incident angle of the first-order diffracted light on the optical film 60 for all the emitting colors, for example, the following structure may be employed. That is, the grating constant of the diffraction grating 30 may be minimized in a portion corresponding to a pixel whose emitting color is blue, maximized in a portion corresponding to a pixel whose emitting color is red, and intermediate therebetween in a portion corresponding to a pixel whose emitting color is green.

A scattering gain of the optical film 60 is, for example, 10 to 100. It is noted that the term "scattering gain" used here means "normal brightness/(irradiance on incidence plane× transmittance of film/Π)".

When the scattering gain is large, a scattering power of the optical film 60 is small, and the above-described effects may not clearly appear. On the other hand, when the scattering gain is small, a scattering power of the optical film 60 is excessively large, and light components going back to the light-transmitting insulating layer may be increased due to back scattering. In this case, it may be difficult to achieve high outcoupling efficiency, and the color mixture may easily occur. Further, in this case, scattering of extraneous light by the optical film 60 may become great, and the definition of picture image may be lowered.

When the scattering gain of the optical film 60 is relatively small, for example, 10 to 50, dependency of luminance on observation angle can be lowered. Therefore, such an optical film 60 is suitable for use in a large-sized organic EL display 1.

On the other hand, when the scattering gain of the optical film 60 is relatively large, for example, 50 to 100, a higher directivity can be achieved. Therefore, such an optical film 60 is suitable for use in a small-sized organic display mounted on a portable device, etc.

An angle θ (referred to as an inclination angle θ hereinafter) which an interface between the first portion 61 and the second portion 62 makes with a line normal to a main surface of the optical film 60 is, for example, 5° to 60°.

When viewing a main surface of the optical film 60, a width $W_1$ of the first portion 61 and a width $W_2$ of the second portion 62 may be equal to each other or different from each other. Typically, a ratio of the width $W_1$ to the width $W_2$ is less than 1, for example, about 0.2 to about 0.8. Typically, the width $W_1$ is about 2 μm to about 40 μm, and the width $W_2$ is about 1 μm to 20 μm.

Typically, a refractive index n of the first portion 61 and an ordinary index $n_o$ of the second portion 62 are substantially the same. An absolute value of a difference between them is, for example, equal to or less than 0.02.

An absolute value of a difference between an extraordinary index $n_e$ and the ordinary index $n_o$ of the second portion 62 is, for example, equal to or more than 0.1, and typically, equal to or more than 0.2. Typically, the difference between the extraordinary index $n_e$ and the ordinary index $n_o$ of the second portion 62 is equal to or less than 0.3.

Examples of the present invention will be described below.

EXAMPLE 1

Figure 4:
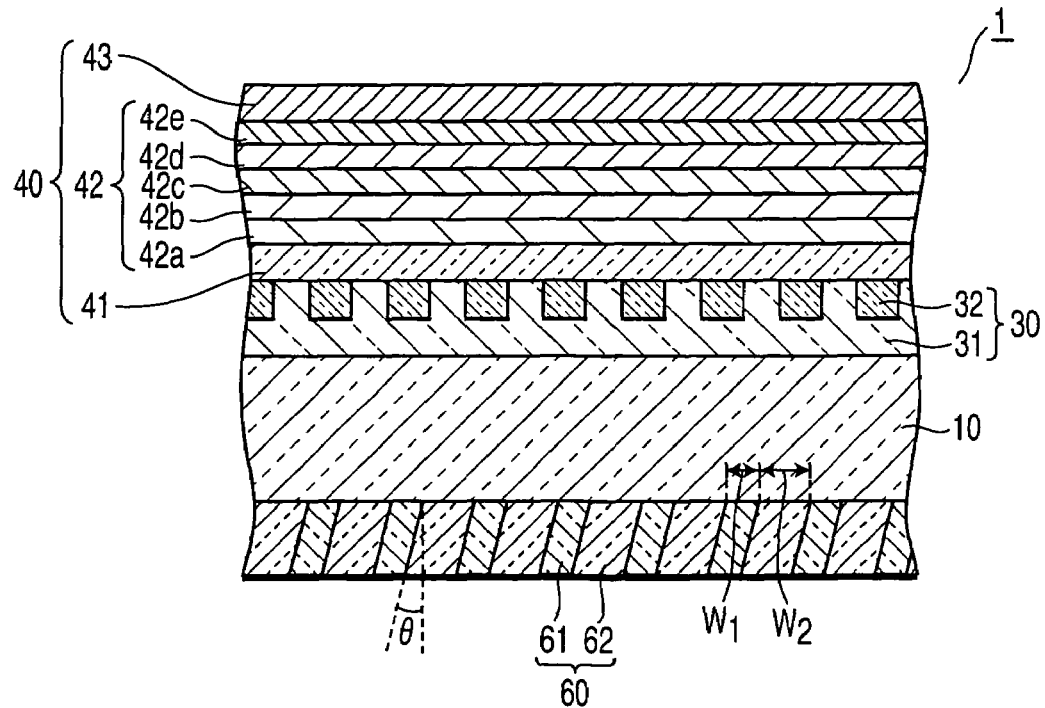
FIG. 4 is a cross sectional view schematically showing an organic EL display according to an example of the present invention.

FIG. 4 is a cross sectional view schematically showing an organic EL display according to an example of the present invention. In this example, the organic EL display 1 shown in FIG. 4 was manufactured by the following method.

First, a thin film 31 made of organic material and having a thickness of 100 nm was formed on a main surface of a glass substrate 10, and recesses were formed in the thin film. The recesses of the thin film was filled with a Low-k film 32. Thus, a diffraction grating with a grating constant of 0.7 μm was obtained.

Next, ITO was deposited on the diffraction grating 30 by mask sputtering to obtain front electrodes with a thickness of 100 Å.

Thereafter, a hole injection layer 42a, a hole transporting layer 42b, a light-emitting layer 42c, an electron transporting layer 42d, and an electron injection layer 42e were formed in this order on the front electrodes 41 by evaporation. Thus, organic layers with a refractive index of 1.9 and a thickness of 250 nm were obtained. Note that the organic layers emit light with a wavelength of 540 nm.

On the organic layers 42, a back electrode 43 made of aluminum was formed by evaporation to complete an array substrate.

Next, an ultraviolet curing resin was applied to a periphery of a main surface of a glass substrate, which was prepared separately from the array substrate, to form a seal layer. This glass substrate and the array substrate were put together in an inert gas atmosphere such that the surface on which the seal layer was formed and the surface on which the back electrode 43 was formed face each other. Then, the seal layer was cured by ultraviolet irradiation.

In addition, an optical film 60 was attached to an outer surface of the substrate 10. In this way, the organic EL display 1 shown in FIG. 4 was completed.

It is noted that the optical film 60 in this example included first portions 61 made of polycarbonate (n=1.55) and second portions 62 made of a liquid crystal polymer ($n_o$=1.53, $n_e$=1.75). In the optical film 60, the width $W_1$ of the first portion 61 was 50 μm, the width $W_2$ of the second portion 62 was 50 μm, and the inclination angle θ which an interface between the first portion 61 and the second portion 62 makes with a line normal to a main surface of the optical film 60 was 40°. In addition, the scattering gain of the optical film 60 was 40.

EXAMPLE 2

The organic EL display 1 shown in FIG. 4 was manufactured by the same method as described in Example 1 except that the optical film 60 with the following structure was used. That is, the optical film 60 used in this example was the same as that used in the Example 1 except that the inclination angle θ was 20°. Note that the scattering gain of the optical film 60 was 80.

COMPARATIVE EXAMPLE 1

An organic EL display was manufactured by the same method as described in Example 1 except that the optical film 60 with the following structure was used. That is, the optical film 60 used in this example was the same as that used in the Example 1 except that the inclination angle θ was 0°. Note that the scattering gain of the optical film 60 was 120.

COMPARATIVE EXAMPLE 2

An organic EL display was manufactured by the same method as described in Example 1 except that the optical film 60 was omitted.

Total luminous flux emitted by the organic EL display was measured for the organic EL displays according to Examples 1 and 2 and Comparative examples 1 and 2. The result is summarized in the TABLE 1 below.

TABLE 1

|  | Example 1 | Example 2 | Comparative example 1 | Comparative example 2 |
|---|---|---|---|---|
| Optical film | Employed | Employed | Employed | Omitted |
| Inclination θ (°) | 40 | 20 | 0 | — |
| Total luminous flux | 2.5 | 2.0 | 1.3 | 1 |

In TABLE 1, each total luminous flux is shown as a relative value when the total luminous flux emitted by the organic EL display according to Comparative example 2 is supposed to be 1. As shown in TABLE 1, each organic EL display 1 with the optical film 60 is higher in outcoupling efficiency than the organic EL display with no optical film 60. As is apparent from a comparison between the data obtained for the organic EL display 1 according to Comparative example 1 and the data obtained for the organic EL display according to Comparative example 2, even in the case that the optical film 60 is used, outcoupling efficiency can be slightly increased if the interface between first portion 61 and the second portion 62 is perpendicular to a main surface of the optical film 60. In contrast, outcoupling efficiency can be greatly increased if the interface between first portion 61 and the second portion 62 is inclined with respect to a main surface of the optical film 60.

Next, a dependency of luminance on the observation angle was measured for each organic EL display according to Examples 1 and 2 and Comparative example 1. The result is shown in TABLE 2 and FIG. 5.

TABLE 2

|  |  | Normalized luminance | | |
|---|---|---|---|---|
|  |  | Example 1 | Example 2 | Comparative example 1 |
| Inclination (°) |  | 40 | 20 | 0 |
| Observation angle (°) | −90 | 0.01 | 0.01 | 0.01 |
|  | −80 | 0.30 | 0.30 | 0.15 |
|  | −70 | 0.35 | 0.35 | 0.20 |
|  | −60 | 0.60 | 0.60 | 0.34 |
|  | −50 | 0.85 | 0.70 | 0.45 |
|  | −40 | 1.00 | 0.80 | 0.70 |
|  | −30 | 0.90 | 0.90 | 0.85 |
|  | −20 | 0.85 | 1.00 | 0.94 |
|  | −10 | 0.80 | 0.90 | 0.95 |
|  | 0 | 0.80 | 0.85 | 1.00 |
|  | +10 | 0.75 | 0.80 | 0.95 |
|  | +20 | 0.70 | 0.70 | 0.90 |
|  | +30 | 0.65 | 0.65 | 0.70 |
|  | +40 | 0.55 | 0.50 | 0.60 |
|  | +50 | 0.40 | 0.30 | 0.40 |
|  | +60 | 0.35 | 0.20 | 0.30 |
|  | +70 | 0.15 | 0.10 | 0.20 |
|  | +80 | 0.05 | 0.05 | 0.10 |
|  | +90 | 0 | 0 | 0 |

Figure 5:
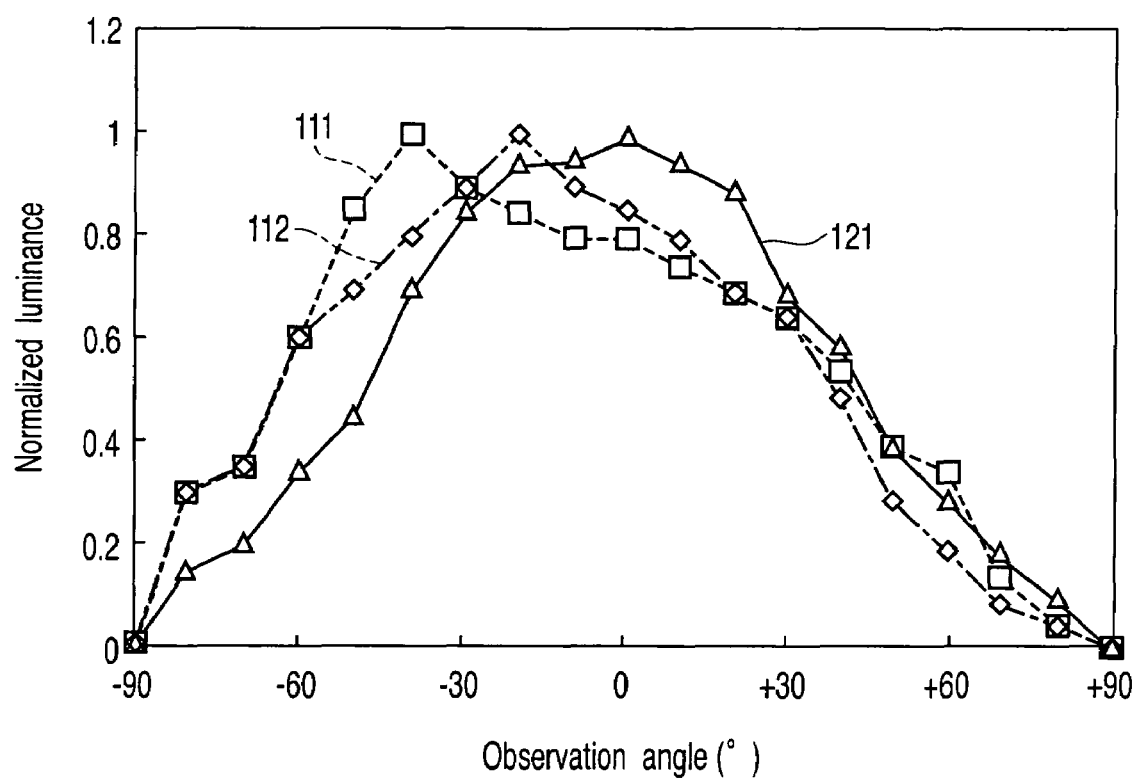
FIG. 5 is a graph illustrating dependencies of luminance on observation angle obtained on organic EL displays according to Examples 1 and 2 and Comparative Example 1.

FIG. 5 is a graph illustrating dependencies of luminance on observation angle obtained on organic EL displays according to Examples 1 and 2 and Comparative Example 1. In the figure, the abscissa indicates an observation angle, i.e., an angle which a line perpendicular to the display surface makes with a line-of-sight, and the ordinate indicates a normalized luminance when the maximum luminance is supposed to be 1. Further, in the figure, the curves 111 and 112 represent data obtained on the organic EL displays according to Examples 1 and 2, respectively, and the curve 121 represents data obtained on the organic EL display according to Comparative example 1.

As apparent from TABLE 2 and FIG. 5, the organic EL displays 1 according to Examples 1 and 2 have a wider range of observation angle within which a high-luminance image can be observed as compared with the organic EL display 1 according to Comparative example 1. For example, supposing that the viewing angle is a range of observation angle within which the normalized luminance is equal to or more than 0.6, a viewing angle of the organic EL display 1 according to Comparative example 1 is about 80°, whereas viewing angles of the organic EL displays 1 according to Examples 1 and are about 95° and 90°, respectively. Although not shown in the figure, the viewing angle of the organic EL display according to Comparative example 2 is about 30°.

As described above, in the case where the interface between the first portion 61 and the second portion 62 is inclined with respect to the main surface of the optical film 60, a higher outcoupling efficiency and a wider viewing angle can be achieved as compared with the case where the interface is perpendicular to the main surface of the optical film 60 or the case where the optical film 60 is omitted. Note that in the case where a diffusion film including a transparent matrix and transparent particles dispersed in the transparent matrix and different in refractive index from the transparent matrix was used, the outcoupling efficiency was lowered although a wider viewing angle can be achieved as compared with the case where the optical film 60 was used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display comprising:
    an insulating layer with light-transmission property;
    an organic EL element disposed on a back side of the insulating layer;
    a diffraction grating disposed on the back side of the insulating layer; and
    an optical film disposed on a front side of the insulating layer and comprising optically isotropic first portions and optically anisotropic second portions, the first and second portions forming boundaries inclined with respect to a main surface of the optical film.

2. The display according to claim 1, wherein at least one optic axis of each of the second portions is parallel to the boundaries.

3. The display according to claim 1, wherein a normal axis perpendicular to the main surface crosses the boundaries at an angle θ of 5° to 60°.

4. The display according to claim 1, wherein an absolute value of a difference between a refractive index n of the first portions and an ordinary index $n_o$ of the second portions is 0.02 or less.

5. The display according to claim 1, wherein an absolute value of a difference between an extraordinary index $n_e$ and an ordinary index $n_o$ of the second portions is 0.1 or more.

6. The display according to claim 1, wherein a scattering gain of the optical film falls within a range from 10 to 100.

7. The display according to claim 1, wherein the diffraction grating is disposed between the insulating layer and the organic EL element.

8. The display according to claim 1, wherein the diffraction grating is disposed on a back side of the organic EL element.

9. An organic EL display comprising:
    an insulating layer with light-transmission property;
    an organic EL element disposed on a back side of the insulating layer;
    a diffraction grating disposed on the back side of the insulating layer; and
    an optical film disposed on a front side of the insulating layer and comprising optically isotropic first portions and optically anisotropic second portions, the first and second portions forming a stripe pattern inclined with respect to a main surface of the optical film when a cross section of the optical film perpendicular to the main surface is observed.

10. The display according to claim 9, wherein at least one optic axis of each of the second portions is parallel to boundaries which the first and second portions form.

11. The display according to claim 9, wherein the stripe pattern is inclined to the main surface at an angle θ of 5° to 60°.

12. The display according to claim 9, wherein an absolute value of a difference between a refractive index n of the first portions and an ordinary index $n_o$ of the second portions is 0.02 or less.

13. The display according to claim 9, wherein an absolute value of a difference between an extraordinary index $n_e$ and an ordinary index no of the second portions is 0.1 or more.

14. The display according to claim 9, wherein a scattering gain of the optical film falls within a range from 10 to 100.

15. The display according to claim 9, wherein the diffraction grating is disposed between the insulating layer and the organic EL element.

16. The display according to claim 9, wherein the diffraction grating is disposed on a back side of the organic EL element.

* * * * *